(12) United States Patent
Hara et al.

(10) Patent No.: US 8,385,160 B2
(45) Date of Patent: Feb. 26, 2013

(54) MAGNETIC RECORDING ELEMENT USED FOR THERMALLY-ASSISTED MAGNETIC RECORDING

(75) Inventors: Shinji Hara, Tokyo (JP); Tsutomu Chou, Tokyo (JP); Tetsuya Roppongi, Tokyo (JP); Daisuke Miyauchi, Tokyo (JP); Kosuke Tanaka, Tokyo (JP)

(73) Assignee: TDK Corporation, Tokyo (JP)

( * ) Notice: Subject to any disclaimer, the term of this patent is extended or adjusted under 35 U.S.C. 154(b) by 269 days.

(21) Appl. No.: 12/837,725

(22) Filed: Jul. 16, 2010

(65) Prior Publication Data

US 2012/0014230 A1   Jan. 19, 2012

(51) Int. Cl.
  *G11B 11/00*   (2006.01)
(52) U.S. Cl. ................... 369/13.33; 369/112.27
(58) Field of Classification Search .............. 369/13.32, 369/13.33, 13.24, 13.14, 13.02, 13.12, 112.27, 369/112.09, 112.14, 112.21, 13.35, 13.17; 360/59; 385/28, 43, 129, 88
See application file for complete search history.

(56) References Cited

U.S. PATENT DOCUMENTS

| | | | |
|---|---|---|---|
| 6,016,290 A * | 1/2000 | Chen et al. ................. | 369/13.17 |
| 7,330,404 B2 | 2/2008 | Peng et al. | |
| 8,064,741 B2 * | 11/2011 | Cherchi et al. .................. | 385/28 |
| 8,149,654 B2 * | 4/2012 | Komura et al. ............ | 369/13.33 |
| 8,295,010 B2 * | 10/2012 | Shimazawa et al. ..... | 360/125.31 |
| 2008/0151431 A1 | 6/2008 | Tanaka et al. | |
| 2008/0205202 A1 | 8/2008 | Komura et al. | |
| 2008/0239541 A1 | 10/2008 | Shimazawa et al. | |
| 2012/0082016 A1 * | 4/2012 | Komura et al. ............ | 369/13.33 |

FOREIGN PATENT DOCUMENTS

JP   A-2009-070554   4/2009

\* cited by examiner

*Primary Examiner* — Ali Neyzari
(74) *Attorney, Agent, or Firm* — Posz Law Group, PLC

(57) ABSTRACT

A magnetic recording element that faces a recording medium and that executes a magnetic recording while the recording medium is heated, the element including a waveguide that is configured with a core and a cladding, the core, through which laser light propagates, including an enlarged part, which is enlarged at an air bearing surface facing the recording medium; and the cladding surrounding a periphery of the core.

7 Claims, 9 Drawing Sheets size of enlarged part of core in y direction (μm)

MAGNETIC RECORDING ELEMENT USED FOR THERMALLY-ASSISTED MAGNETIC RECORDING

BACKGROUND OF THE INVENTION

1. Field of the Invention

The present invention relates to a magnetic recording element that is used for thermally-assisted magnetic recording in which information is recorded while decreasing the coercive force of a magnetic recording medium using near-field light irradiated onto the magnetic recording medium.

2. Description of the Related Art

In recent years, in association with the high recording density of magnetic recording devices such as magnetic disk devices, there are demands for performance improvements of a thin film magnetic head and a magnetic recording medium. A composite-type thin film magnetic head, in which a reproducing head having a magneto resistive effect element (MR element) for reading and a recording head having an inductive-type electromagnetic transducer (a magnetic recording element) for writing are laminated on a substrate, has widely been used for the thin film magnetic head. In magnetic disk devices, the thin film magnetic head is disposed on a slider that flies just above a surface of the magnetic recording medium.

The magnetic recording medium is a discontinuous medium on which magnetic microparticles gather. Each of the microparticles has a single magnetic domain structure. In the magnetic recording medium, one recording bit is configured with a plurality of magnetic microparticles. In order to increase the recording density, the asperity of a boundary of adjacent recording bits needs to be small. For this, the size of the magnetic microparticles needs to be decreased. However, when the size of the magnetic microparticles is decreased, the volume of the magnetic microparticles decreases. Accordingly, thermal stability of the magnetization of the magnetic microparticles also decreases. In order to solve this problem, increasing the anisotropic energy of the magnetic microparticles is effective. However, when the anisotropic energy of the magnetic microparticles is increased, the coercive force of the magnetic recording medium is also increased. As a result, it becomes difficult to record information using a conventional magnetic recording element. The conventional magnetic recording element has such a drawback, and this is a large obstacle to achieving an increase in the recording density.

As a method to solve this problem, a so-called thermally-assisted magnetic recording method is proposed. In this method, a magnetic recording medium having a large coercive force is utilized. The magnetic field and heat are simultaneously added to a part of the magnetic recording medium where information is recorded when the information is recorded. Using this method, the information is recorded in a state where the temperature of the information record part is increased and the coercive force is decreased.

For a thermally-assisted magnetic recording, a method in which a laser light source is used to heat the magnetic recording medium is common. Such a method, is really two methods: one method is to heat the magnetic recording medium by guiding laser light to a recording unit via a waveguide, etc. (a direct heating type); and the other method is to heat the magnetic recording medium by converting the laser light to near-field light (a near-field light heating type). The near-field light is a type of so-called electromagnetic field, which is formed around a substance. Ordinary light cannot be focused to a region that is smaller than its wavelength due to diffraction limitations. However, when light having an identical wavelength is irradiated onto a microstructure, near-field light that depends on the scale of the microstructure is generated, enabling the light to be focused onto a minimal region, such as a region only tens of nm in size.

In U.S. Patent Application Publication No. 2008/205202, another configuration is disclosed in which a near-field generator is disposed in a front part of a core of a waveguide through which light from a light emission element (a laser diode) propagates.

In U.S. Patent Application Publication No. 2008/151431, a configuration is disclosed in which a near-field generator plate and a near-field scatter plate are disposed in a front part of a waveguide in which the light enters and propagates. The near-field generator plate has a sharp end part on one end. The near-field scatter plate is arranged along an edge part that is on the opposite side of the sharp end part of the near-field generator plate.

In Japanese Laid-Open Patent Publication No. 2009-070554, a configuration is disclosed in which a low refractive index part made of $SiO_2$ is disposed between a near-field generator and a core of a waveguide in which light enters and propagates. A refractive index of $SiO_2$ that configures the low refractive index part is smaller than that of $Ta_2O_5$ that configures the core.

In U.S. Patent Application Publication No. 2008/239541, a configuration is disclosed, in which a second core is disposed between a near-field generator and a first core of a waveguide into which light enters and propagates. It discloses that the second core is preferably configured by alternatively laminating two types of materials having different refractive indices.

A so-called plasmon antenna is used to generate the near-field light in a conventional concrete method, in which a metal, referred to as a near-field light probe, is used for generating the near-field light by light-excited plasmon.

Direct irradiation of light generates the near-field light in the plasmon antenna. However, with this method, a conversion efficiency for converting irradiated light into the near-field light is low. Most of the energy of the irradiated light on the plasmon antenna reflects off the surface of the plasmon antenna or is converted into thermal energy. The size of the plasmon antenna is set to be the wavelength of the light or less. Accordingly, the volume of the plasmon antenna is small. Therefore, the temperature of the plasmon antenna significantly increases according to the above-described generation of heat.

Due to the temperature increase, the volume of the plasmon antenna expands, and the plasmon antenna protrudes from an air bearing surface that is a surface facing the magnetic recording medium. Accordingly, the distance between an edge part of the air bearing surface of the MR element and the magnetic recording medium increases. As a result, it becomes difficult to read servo signals recorded on the magnetic recording medium during the recording process. Moreover, when the heat generation is large, the plasmon antenna may melt.

Currently, a technology is proposed that does not directly irradiate light onto the plasmon antenna. For example, U.S. Pat. No. 7,330,404 discloses a technology in which light propagating through a waveguide, such as an optical fiber, is coupled in a surface plasmon mode via a buffer portion to a plasmon generator, so that the surface plasmon is excited in the plasmon generator. In this technology, the light is not directly irradiated onto the plasmon antenna. The plasmon generator includes a near-field generator that is positioned on the air bearing surface and that generates the near-field light. At the interface between the waveguide and the buffer portion, the light propagating through the waveguide is completely reflected. However, at the same time, light is generated that penetrates into the buffer portion, which is referred to as evanescent light. The evanescent light and a collective oscillation of charges in the plasmon generator are coupled, and then the surface plasmon is excited in the plasmon generator. The excited surface plasmons propagate to the edge of near-field-generator along the plasmon generator, so that near-field light is generated in the near-field generator. According to this technology, since the light propagating through the waveguide is not directly irradiated to the plasmon generator, the excessive temperature increase of the plasmon generator can be prevented.

In a thermally-assisted recording, which performs a recording while heating a predetermined position of the magnetic recording medium, temperatures of both the magnetic recording medium and a magnetic recording element itself are increased (for example, to approximately 200-300° C.). This temperature increase is caused due to laser light that is directly guided to the vicinity of the air bearing surface by being propagating through the waveguide, and by a loss that occurs when the laser light is converted to the near-field light.

Generally, a material of the waveguide in the magnetic recording element is $TaO_x$, $AlO_x$, $AlN_x$, $SiO_x$, $SiN_x$, SiON, $MgF_x$, Si, or the like. Of these materials, the materials having a high refractive index are used for the core, and the materials having a low refractive index are used for a cladding. Each element configuring these materials has a characteristic of a covalent bond and has a dangling bond on the surface. The dangling bond is active. Accordingly, an interface between such materials is significantly active. This is obvious from that, for example, Lewis acid sites and/or Bronsted acid sites are generated in solid solutions of oxides and function as a catalyser.

When the temperature of the magnetic recording element itself increases, as described above, high pressure (for example, approximately 10 atmospheric pressure) applied to the air bearing surface at the time of the slider flying, and water vapor in atmosphere applied to the interface of different materials under a state having such chemical active sites, may cause an alteration of the material and/or a deformation of the thermally-assisted magnetic recording head to occur.

Specifically, in an experiment by the applicant, when a thermally-assisted recording was executed using a magnetic recording element that includes a waveguide having a core made of $TaO_x$ and a cladding made of $AlO_x$, it is confirmed that Al is bonded to hydroxyl (AlOH) and adheres on the magnetic recording medium. Also, Ta may be melted and altered by touching the water vapor under high temperature and high pressure.

Also, when the heat expansion ratios of the materials contacting each other at the interface are different, huge stress may cause a gap to be formed between the materials due to the difference of the heat expansion at the time of heating, which may result in the deformation of the magnetic recording element.

SUMMARY OF THE INVENTION

An objective of the present invention is to provide a magnetic recording element that suppresses an alteration and/or deformation of a material due to a temperature increase of the magnetic recording element itself during a thermally-assisted magnetic recording.

In the present invention, a magnetic recording element facing a recording medium and executing a magnetic recording while the recording medium is heated includes a waveguide that is configured with a core and a cladding, the core, through which laser light propagates, including an enlarged part, which is enlarged at an air bearing surface facing the recording medium, and the cladding surrounding a periphery of the core.

The magnetic recording element might include a near-field generator positioned to face the core, including the enlarged part, at the air bearing surface.

Further, the magnetic recording element might include a main magnetic pole of which an edge part is positioned at the air bearing surface, and a plasmon generator facing a part of the core that includes the enlarged part, and extending to the air bearing surface. In the embodiment, the plasmon generator includes a propagation edge extending in a longitudinal direction. The propagation edge provides an overlapping part that overlaps the core, including the enlarged part, and the near-field generator in the longitudinal direction. The near-field generator is positioned in a vicinity of the edge part of the main magnetic pole on the air bearing surface. The overlapping part of the propagation edge couples with the laser light propagating through the core in a surface plasmon mode and generates a surface plasmon. The propagation edge is configured to let the surface plasmon generated at the overlapping part propagate into the near-field generator.

With the present invention, the temperature increase at the interface between the core and the cladding can be suppressed because of the disposition of the enlarged part. Accordingly, this suppresses the alteration and/or deformation of the materials of the waveguide, and suppresses a chronological decrease of an output of the magnetic recording element. As the result, a stable recording can be enabled.

The above description, as well as other objects, features, and advantages of the present invention will be evident from the following description with reference to attached drawings illustrating the present invention.

DESCRIPTION OF THE PREFERRED EMBODIMENTS

A magnetic recording element of the present invention will be explained with reference to the drawings.

Initially, a fundamental configuration of a magnetic recording element 1 of the present invention will be explained. The magnetic recording element 1 is used for a so-called thermally-assisted magnetic recording, which records information by applying a magnetic field in a state where coercive force is partially reduced by the application of heat to a magnetic recording medium 14.

Figure 1:
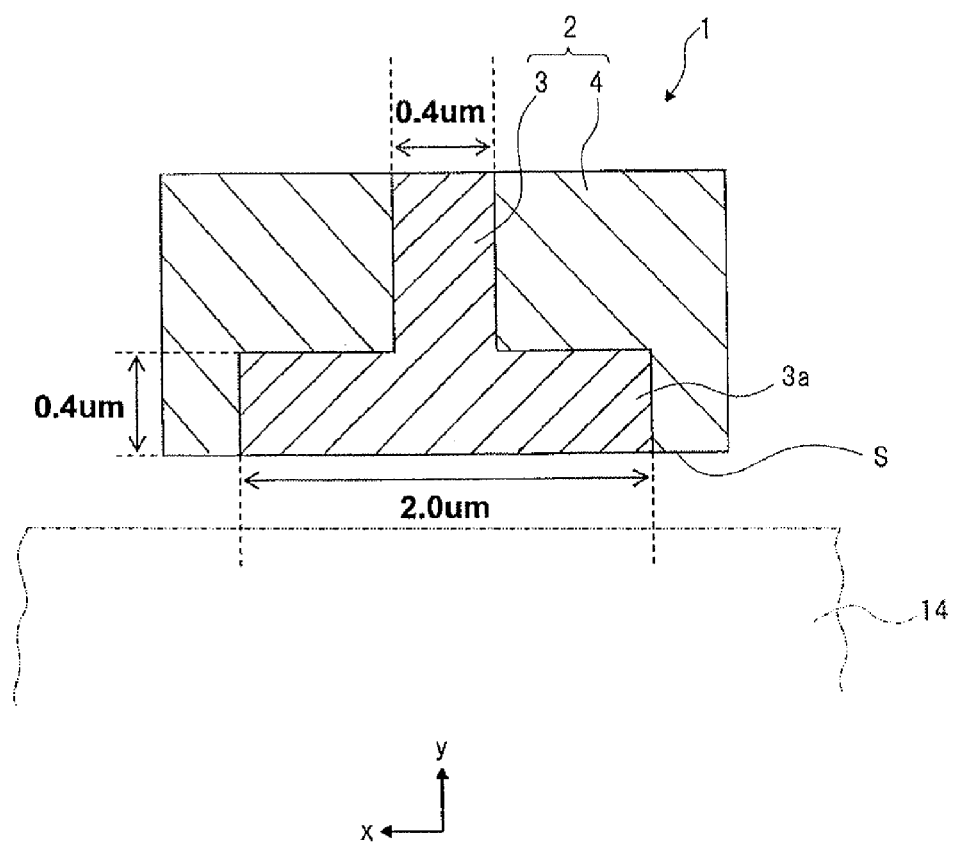
FIG. 1 is a cross sectional view schematically illustrating a main part of a magnetic recording element of the present invention.

As illustrated in FIG. 1, the magnetic recording element 1 includes a waveguide 2 into which laser light used for heating the magnetic recording medium 14 enters. A core 3 configuring the waveguide 2 has an enlarged shape at an air bearing surface S that faces the magnetic recording medium 14. In the example illustrated in FIG. 1, a core 3, in an area other than the vicinity of the air bearing surface, has a cross section that is a square of 0.4 µm×0.4 µm and extends in a perpendicular direction to the air bearing surface S. However, in the vicinity of the air bearing surface S, which is, for example, an area within a distance of 0.4 µm from the air bearing surface S, an enlarged part 3a is disposed. The enlarged part 3a has a fivefold greater length in a transverse direction (x-direction, a cross track direction), which is 2.0 µm.

The magnetic recording element 1 may have either one of two configurations. One is a configuration in which propagating light propagating through the core 3 of the waveguide 2 is directly irradiated onto the magnetic recording medium 14, so that the magnetic recording medium 14 is heated. The other is a configuration in which the propagating light that propagates through the core 3 of the waveguide 2 is converted to near-field light and the near-field light heats the magnetic recording medium 14. With either configuration, the heat application center is in general a center of the core 3 that is in the air bearing surface S or its vicinity. As described above, when the magnetic recording medium 14 is heated around the center of the core 3 or its vicinity, the temperature of the magnetic recording element 1 itself increases around the center of the core 3 at the air bearing surface S or its vicinity. At this time, an increase in the temperatures of an interface of the cladding 4 and the core 3 that make up the waveguide 2 may cause an alteration and/or a deformation of the materials of the core 3 and the cladding 4. However, since in the present invention the enlarged part 3a of the core 3 is disposed over the air bearing surface S, the interface of the enlarged part 3a of the core 3 and the cladding 4 is positioned away from the center of the core 3 or its vicinity to be the heat application center. Therefore, even during the heating of the magnetic recording medium 14, the temperatures at the interface of the enlarged part 3a of the core 3 and the cladding 4 are not significantly increased. As a result, any alteration and/or deformation of the materials is suppressed.

Figure 2:
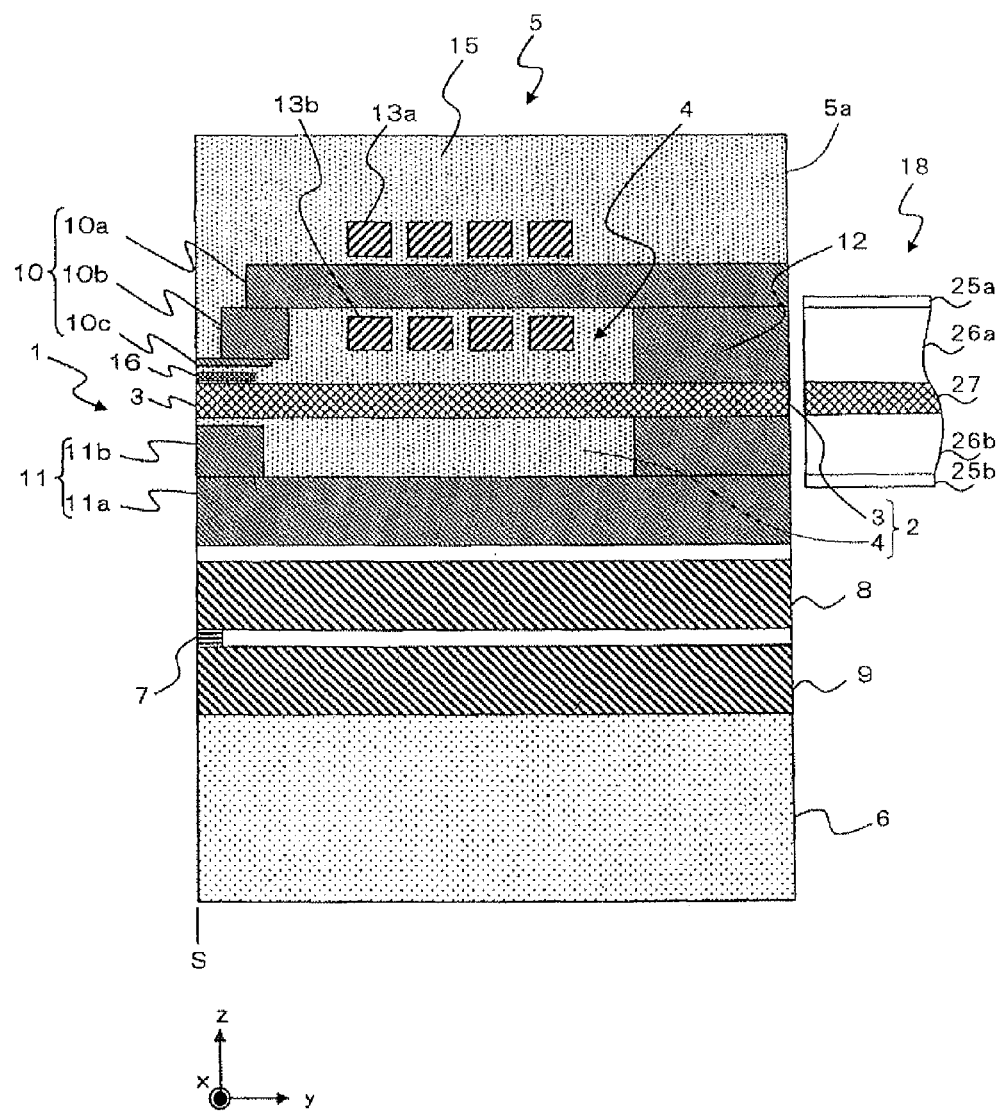
FIG. 2 is a cross sectional view of a main part of a slider including the magnetic recording element illustrated in FIG. 1.
Figure 3:
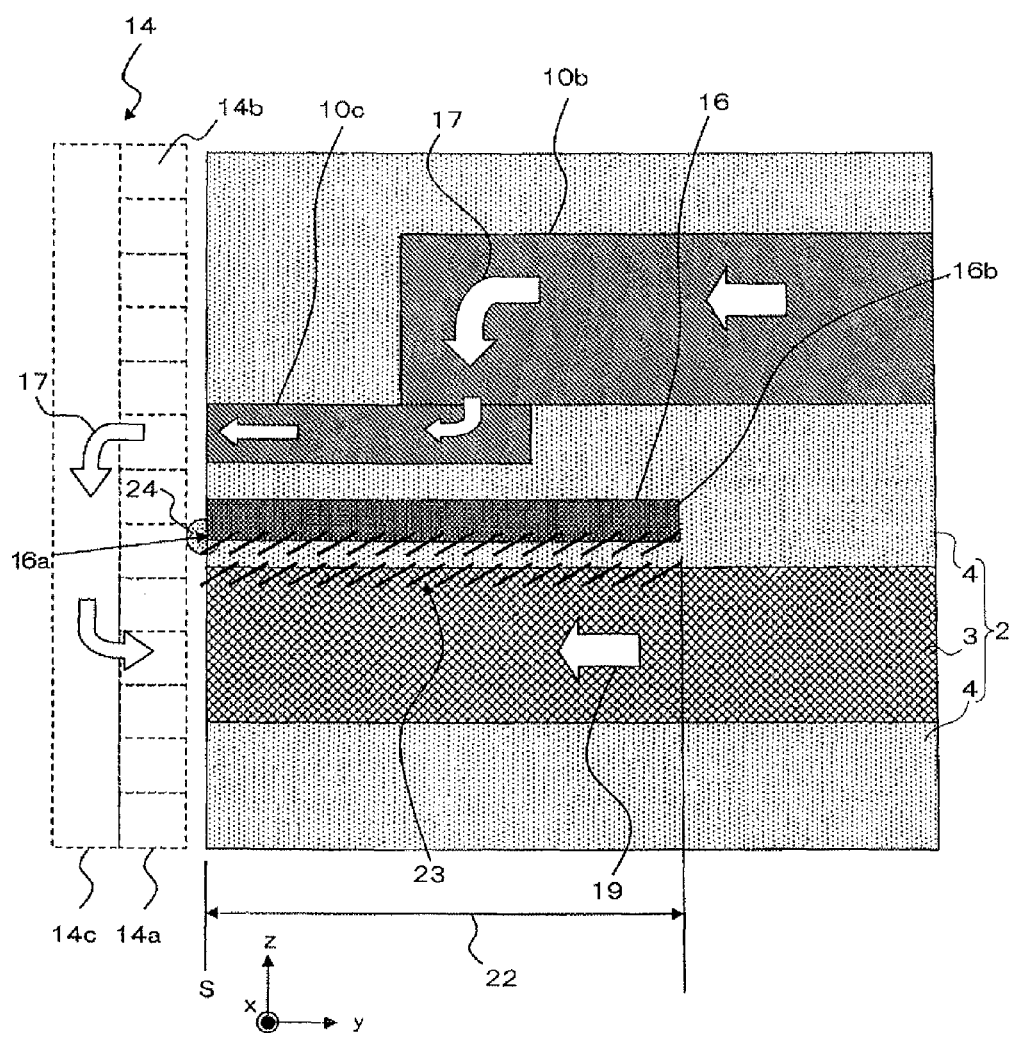
FIG. 3 is an enlarged view of the vicinity of the magnetic recording element illustrated in FIG. 2.

The magnetic recording element 1 of the present invention will be explained in more detail. FIG. 2 is a cross sectional view of a main part of a slider 5 including the magnetic recording element 1 of the present invention. FIG. 3 is an enlarged view of one part of it. The slider 5 has a configuration in which an MR element 7, configured as a reproductive head part, and the magnetic recording element 1, configured as a recording head part, are layered on a substrate 6 made from ALTIC ($Al_2O_3 \cdot TiC$). In addition, in the following explanation, a "lamination direction" indicates a direction of a film formation in a wafer process and a film surface orthogonal direction, and it is identical to the z-direction in each of the drawings. An "upward lamination direction" indicates a direction orientated toward an overcoat layer 15 from the substrate 6, and a "downward lamination direction" indicates a direction orientated toward the substrate 6 from the overcoat layer 15.

The slider 5 provides, the MR element 7 as the reproductive head part, in which its tip part is exposed to the air bearing surface S, and an upper shield layer 8 and a lower shield layer 9 disposed in a manner sandwiching the MR element 7 from both an upper side and a lower side in the lamination direction. The MR element 7 can have any configuration that uses a magneto resistive effect, such as a current-in-plane (CIP)—giant-magneto-resistive (GMR) element in which a sense current flows in the direction parallel to the film surface, a current-perpendicular-to-plane (CPP)—giant-magneto-resistive (GMR) element in which the sense current flows in the direction perpendicular to the film surface, or a tunneling-magneto-resistive (TMR) element that uses a tunnel effect. When a CPP-GMR element or a TMR element is applied to the MR element 7, the upper shield layer 8 and the lower shield layer 9 are also utilized as electrodes to supply the sense current.

The slider 5 provides the magnetic recording element 1 for so-called perpendicular magnetic recording that configures the recording head part (a thermally-assisted magnetic recording head). The magnetic recording element 1 has a main magnetic pole 10 for recording. The main magnetic pole 10 has a first body part 10a, a second body part 10b, and a magnetic pole tip part 10c, all of which are formed of an alloy made of any two or three of Ni, Fe, and Co. A return shield layer 11 is disposed beneath the main magnetic pole 10 in the lamination direction. The return shield layer 11 has a first body part 11a and a second body part 11b, both of which are also formed of an alloy made of any two or three of Ni, Fe and Co. The main magnetic pole 10 and the return shield layer 11 are magnetically linked to each other via a contact part 12. In the present embodiment, the return shield layer 11 is disposed beneath the main magnetic pole 10 in the lamination direction. However, the return shield layer 11 can be also disposed above the main magnetic pole 10 in the lamination direction. The overcoat layer 15 is made of $Al_2O_3$ and is disposed above the main magnetic pole 10 in the lamination direction.

Coils 13a and 13b are wound adjacent to the main pole 10, and are centered around the contact part 12. A magnetic flux is generated at the main magnetic pole 10 by a current applied to the coils 13a and 13b from the outside. The coils 13a and 13b are formed of a conductive material such as Cu, etc. Two layers of the coils 13a and 13b are used in the present embodiment, but one layer or three or more layers are also practical. Furthermore, the number of windings is four in the present embodiment, but should not be limited to four.

The main magnetic pole 10 is tapered at the magnetic pole tip part 10c in the vicinity of the air bearing surface S not only in the film surface orthogonal direction (the z-direction) but also in a track width direction (the x-direction). Referring to FIG. 3, a magnetic flux 17 generated in the main magnetic pole 10 tapers as it travels to the air bearing surface S, and the minute and strong magnetic flux 17 for writing, which is suitable for the high recording density, is discharged toward a magnetic recording medium 14 from the magnetic pole tip part 10c positioned on the air bearing surface S. The magnetic recording medium 14 has a configuration for a perpendicular magnetic recording. A surface layer of the magnetic recording medium 14 is a recording layer 14a. The magnetic flux 17 discharged from the magnetic pole tip part 10c travels in the recording layer 14a in the perpendicular direction (the y-direction), and magnetizes each recording bit 14b of the recording layer 14a in the perpendicular direction. After the magnetic flux 17 passes through the recording layer 14a, the magnetic path of the magnetic flux 17 turns to an in-plane direction of the magnetic recording medium 14 (the z-direction) in an under layer 14c made from a soft magnetic body that is positioned below the recording layer 14a. Furthermore, the direction of the magnetic flux 17 changes to the perpendicular direction (the y-direction) again in the vicinity of the return shield layer 11, and the magnetic flux 17 is absorbed by the return shield layer 11. In other words, the return shield layer 11 functions to control the magnetic flux 17 such that the magnetic flux 17 passes perpendicularly through the recording layer 14a and creates a U-shaped magnetic path.

Furthermore, the second body part 11b of the return shield layer 11 forms a trailing shield part whose layer cross section is wider in the track width direction (the x-direction) than the first body part 11a. The placement of the return shield layer 11 causes a steep gradient of the magnetic field between the return shield layer 11 and the main magnetic pole 10 in the vicinity of the air bearing surface S. As a result, signal output jitter is reduced and an error rate at the time of reading is decreased.

Referring to FIG. 2, the waveguide 2 and a plasmon generator 16 are disposed between the main magnetic pole 10 and the return shield layer 11. The waveguide 2 is configured with the core 3 and the cladding 4 surrounding the core 3. The core 3 has a higher refractive index than the cladding 4. As described above, in the present invention, the core 3 includes the enlarged part 3a, which is enlarged at an edge part of the air bearing surface S side. The laser light 19 (see FIG. 3) entering from the light source 18, which will be described later, propagates to the air bearing surface S, reflecting completely at the interface of the core 3 and the cladding 4. The cladding 4 is formed of, for example, $AlO_x$. The core 3, including the enlarged part 3a, is formed of, for example, $TaO_x$. Herein, $AlO_x$ indicates aluminum oxide of arbitrary composition. $Al_2O_3$ is typical, however, $AlO_x$ is not limited to this. Similarly, $TaO_x$ indicates tantalum oxide of arbitrary composition. $Ta_2O_5$, TaO, $TaO_2$, etc. are typical, although $TaO_x$ is not limited to these. In order to connect to the light source 18, the core 3 extends from the enlarged part 3a positioned on the air bearing surface S to a back side 5a of the slider 5. In addition, though not illustrated in the drawings, the cladding 4 exists between the core 3 and the contact part 12.

The plasmon generator 16 is positioned away from the substrate 6, and extends to the air bearing-surface S, facing a part of the core 3. The plasmon generator 16 is formed of Au, Ag, Cu, Al, Pd, Ru, Pt, Rh, Ir or an alloy primarily consisting of these metals.

Figure 4:
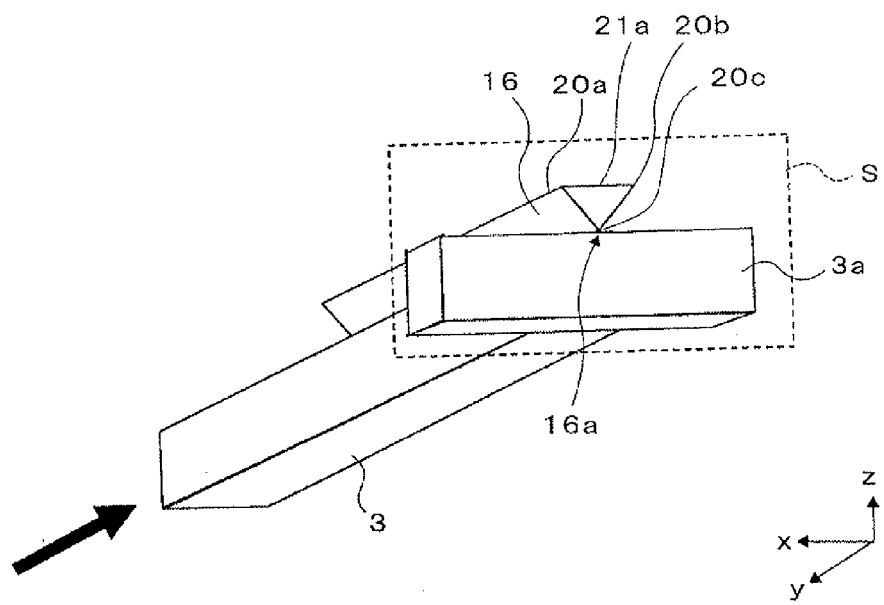
FIG. 4 is a perspective view of a core and a plasmon generator of the magnetic recording element illustrated in FIG. 1.
Figure 5:
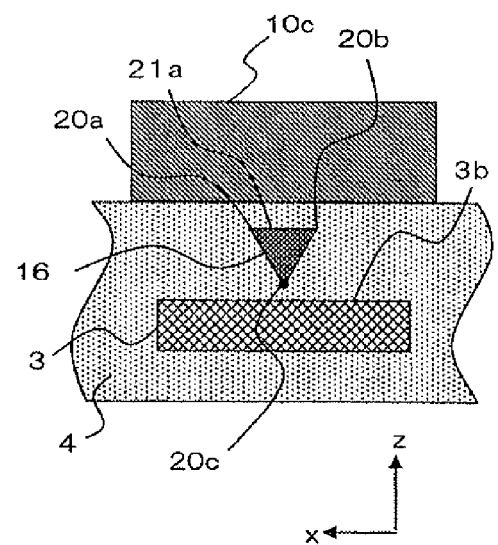
FIG. 5 is a schematical view of a waveguide and the plasmon generator of the magnetic recording element illustrated in FIG. 1, seen from an air bearing surface.

FIG. 4 is a perspective view of the vicinity of the magnetic recording element 1. FIG. 5 is a cross sectional view of the plasmon generator 16 and the waveguide 3 with respect to the x-z plane. As illustrated in these drawings, the plasmon generator 16 is a metallic piece having a substantially-triangular prism shape with a triangular cross section. Referring to FIG. 4, three apexes of the plasmon generator 16 on the triangular cross section respectively form three edges 20a, 20b and 20c extending along the longitudinal direction (the y-direction) of the plasmon generator 16. Thus, the plasmon generator 16 is formed such that one apex of the triangular cross section faces the core 3, including the enlarged part 3a, and this forms a propagation edge 20c facing the core 3. Referring to FIG. 5, among the three sides of the triangular cross section, a side 21a that does not face the core 3, including the enlarged part 3a, is approximately in parallel to an upper surface 3b of the core 3 in the lamination direction. In the explanation below, the triangular cross section illustrated in FIGS. 4 and 5 may be referred to as an inverted triangular cross section.

The plasmon generator 16 extends approximately parallel to the core 3, including the enlarged part 3a, and in a perpendicular direction (the y-direction) with respect to the air bearing surface S. The plasmon generator 16 does not extend up to the back side 5a of the slider 5. The propagating edge 20c facing the core 3, including the enlarged part 3a, includes an overlapping part 22 that overlaps the core 3 in a longitudinal direction of the plasmon generator 16 (the y-direction). The overlapping part 22 couples with the propagating light 19 that propagates through the core 3, including the enlarged part 3a, in a surface plasmon mode so that a surface plasmon 23 is generated (see FIG. 3). A near-field generator 16a is formed at the edge part of the air bearing surface S side of the plasmon generator 16. The near-field generator 16a is positioned in the vicinity of a magnetic pole tip part 10c on the air bearing surface S. The surface plasmon 23 generated in the overlapping part 22 propagates through the propagating edge 20c to the near-field generator 16a along the propagating edge 20c. Near-field light 24 is generated from the near-field generator 16a (see FIG. 3). As described above, a magnetic field from the main magnetic pole 10 and heat from the near-field light 24 are simultaneously applied to a part of the magnetic recording medium 14 where information is recorded at the time of the recording of the information. With this method, a temperature of the part where the information is recorded is increased. Therefore, the information is recorded in a state where coercive force is decreased.

Referring to FIG. 2, the back side 5a of the slider 5 is connected to a light source 18. The light source 18 is a laser diode. The light source 18 has a pair of electrodes 25a and 25b, a positive (P) type cladding 26a and a negative (N) type cladding 26b that are sandwiched by the electrodes 25a and 25b, and an active layer 27 positioned between both of the claddings 26a and 26b, and these cleavage surfaces are in a reflecting mirror structure. The light source 18 is firmly attached to the slider 5 by an appropriate method. The active layer 27 where the laser light 19 continuously oscillates is aligned with the core 3, including the enlarged part 3a, of the magnetic recording element 1 such that the laser light 19 generated in the active layer 27 enters into the core 3. The wavelength of the laser light 19 is not particularly limited, but laser light having a wavelength of approximately 800 nm is preferably used.

In the above-described configuration, for executing the magnetic recording on the magnetic recording medium 14 using the slider 5, the active layer 27 generates the laser light 19 so that the laser light 19 enters into the core 3 facing the active layer 27 when power is supplied to the pair of the electrodes 25a and 25b of the light source 18 that are linked to the back side 5a of the slider 5. The entered laser light 19 propagates through the core 3 toward the air bearing surface S, where the enlarged part 3a is formed. The plasmon generator 16 couples with the propagating light 19 that propagates through the core 3 in the surface plasmon mode in the overlapping part 22 with respect to the core 3, including the enlarged part 3a. In this way, the surface plasmon 23 is generated. The surface plasmon 23 propagates along the propagation edge 20c of the plasmon generator 16 and reaches the near-field generator 16a. In the near-field generator 16a, the near-field light 24 is generated based on the surface plasmon 23. A part of the recording layer 14a of the magnetic recording medium 14 is heated by the near-field light 24 and the coercive force is decreased. A current is applied to the coils 13a and 13b in correspondence to the heating, so that magnetic flux is generated in the main magnetic pole 10, and then the information writing process is executed. Since the near-field generator 16a that executes the heating and the main magnetic pole 10 that executes the writing process are positioned close to each other, the information is sufficiently written in a part in which the coercive force is decreased by the heating.

Figure 6:
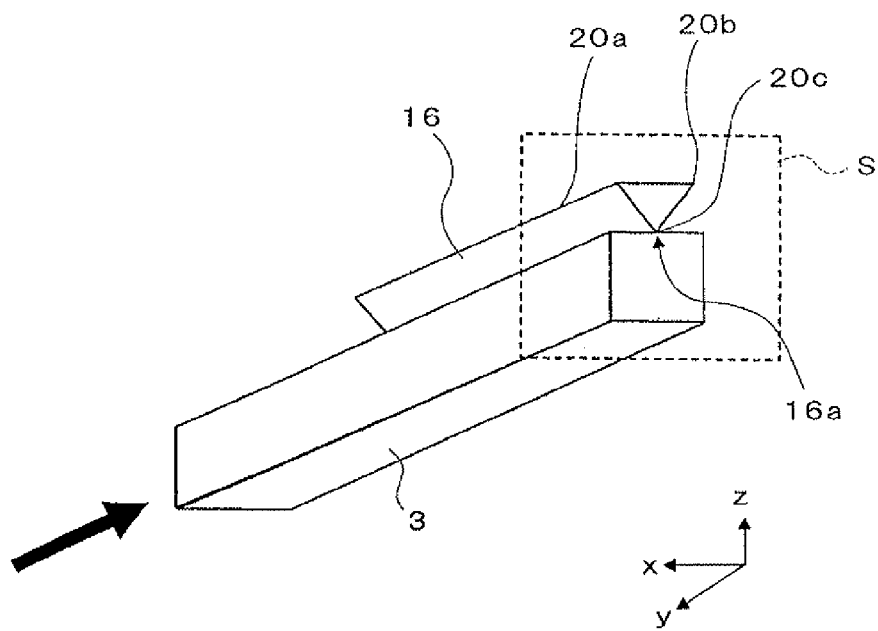
FIG. 6 is a perspective view of a core and the plasmon generator of a magnetic recording element of a comparative example.

During this heating, the temperature of the magnetic recording element 1 itself is increased. This temperature increase occurs around the center of the core 3 seen from the transversal direction (the x-direction) or the vicinity. As illustrated in FIG. 6 as a comparative example, when the core 3 does not have the enlarged part 3a that is enlarged on the air bearing surface S and has a square cross section of approximately 0.4 μm×0.4 μm, the temperature of the interface between the core 3 and the cladding 4 is also significantly increased. Because of such a temperature increase, high pressure caused by the slider 5 flying, and vapor in the atmosphere, the core 3 and/or the cladding 4 may be altered or deformed. For example, $AlO_x$ forming the cladding 4 may be changed to AlOH. On the interface of the core 3 and the cladding 4 where dangling bonds exists and are active, the possibility that the alteration or the deformation occurs is particularly large. In the present invention, as illustrated in FIGS. 1 and 4, the enlarged part 3a of the core 3 is disposed at the air bearing surface S. With this configuration, the interface of the enlarged part 3a of the core 3 and the cladding 4 is positioned away from the center of the heating so that its temperature is not significantly increased. Accordingly, the possibility that the core 3, including the enlarged part 3a, and/or the cladding 4 will be altered or deformed is small. Even if the temperature of the core 3 itself, including the enlarged part 3a is increased, the temperature of the cladding 4, formed of $AlO_x$ that is easily altered to AlOH, is not significantly increased and the temperature of the active interface is not significantly increased. As a result, the alteration and the deformation are suppressed.

In other words, the enlarged part 3a of the core 3 is configured so as to have a form and a size to maintain an appropriate distance by which the interface with the cladding 4 is separated from the center of the heating (the center of the core 3 or the vicinity). The appropriate distance is defined as a distance sufficient so as not to cause the alteration and/or the deformation of the materials due to a temperature increase at the interface between the enlarged part 3a and the cladding 4. A preferable range of a size of the enlarged part 3a of the core 3 will be described below.

Next, one example of a manufacturing method of a head gimbal assembly providing a slider, including the magnetic recording element of the present invention, will be explained.

(1) A lower shield layer 9 was formed on a substrate 6 made of $Al_2O_3$.TiC. An MR element 7 operating as a reproducing element was formed on the lower shield layer 9.

(2) An upper shield layer 8 was formed on the MR element 7.

(3) A return shield layer 11 was formed.

(4) A cladding 4 made of $AlO_x$ was formed by a sputtering method or the like.

(5) A core 3 made of $TaO_x$ was formed by the sputtering method or the like, and side parts thereof were buried with the cladding 4 made of $AlO_x$. At this time, an enlarged part 3a was formed by patterning TaOx on an air bearing surface S of the core 3 and in the vicinity thereof. Specifically, the core 3, including the enlarged part 3a that is widened in a width direction, was formed as follows: a mask having an opening part where a part to be the air bearing surface S is widened was placed on the cladding 4 made of $AlO_x$, and then $TaO_x$ was layered and formed; or after $TaO_x$ was uniformly and widely layered and formed, the mask where a part to be the air bearing surface S was widened was placed, and then $TaO_x$ positioned on the outside of the mask was trimmed and removed by trimming or etching.

(6) A cladding 4 made of $AlO_x$ was formed above the core 3, including the enlarged part 3a. Additionally, this part of the cladding 4 also functions as a dielectric body spacer layer positioned between the core 3, including the enlarged part 3a, and a plasmon generator 16.

(7) The plasmon generator 16, made of Ag and having an inverted triangular cross sectional shape, was formed above the cladding 4.

(8) A cladding 4, made of $AlO_x$, was formed above the plasmon generator 16. In addition, this part of the cladding 4 also functions as the dielectric body spacer layer positioned between the plasmon generator 16 and a main magnetic pole 10. The cladding 4, which configures the waveguide together with the core 3, including the enlarged part 3a, is a portion that is referred to each of the claddings 4 formed in the above-described steps (4)-(6) and (8).

(9) The main magnetic pole 10 and coil layers 13a and 13b were formed.

(10) An overcoat layer 15 was formed.

(11) Not illustrated in the drawings, a wafer in which a plural of thermally assisted magnetic recording head were formed by the above-described steps (1)-(10) was cut into row bars, the air bearing surface S was formed by lapping, and then every piece was cut out as a slider 5.

(12) Not illustrated in the drawings, the slider 5 was jointed to a suspension, and a head gimbal assembly was formed.

(13) A light source (a laser diode) 18 having the wavelength of 800 nm and the waveguide 3 were linked.

In the above explanation, the methods were described how to form the enlarged part 3a widened in the width direction on the air bearing surface S and the vicinity. When the enlarged part 3a of the core 3 is widened in a height direction, the height of $AlO_x$ (the cladding 4) positioned under $TaO_x$ to be the core 3 is partially decreased at the part that will be the air bearing surface S and the vicinity, and then the $TaO_x$ is layered and formed. In this way, the enlarged part 3a, which extends downward in the height direction, may be formed. Also, when the height of the $TaO_x$ that is layered and formed above the $AlO_x$ (the cladding 4) was partially increased at the part that was to be the air bearing surface S and the vicinity, the enlarged part 3a extending upward in the height direction could be formed. With such a method, it is possible to form an enlarged part 3a that is widened not only in the width direction but also in the height direction.

The present applicant manufactured twenty pieces of a slider including the magnetic recording element of the present invention where the core 3, including the enlarged part 3a, which is widened in the width direction in the previously described step (5) as illustrated in FIGS. 1 and 4, was formed, and twenty pieces of a slider including a magnetic recording element of a comparative example where the enlarged part was not included in a core that was formed in the previously described step (5), as illustrated in FIG. 6. Then, a thermally-assisted magnetic recording was executed using each of the sliders with respect to a magnetic recording medium, which is for thermally-assisted magnetic recording and has a high coercive force, and recording-signal outputs were obtained for each of the sliders. The recording-signal outputs are defined as an amount of an output [mV] obtained where magnetic information was written under a certain condition (in the present example, 2 nm of flying height from the air bearing surface of the slider and a frequency corresponding to 1000 kFCI (Flux Change per Inch)) and the written magnetic information was read under the same condition as the time of the writing. Then, after this thermally assisted magnetic recording was continued for 10 hours, the recording signal output was obtained again for each of the sliders. Then, an average value of the recording signal output of an initial state of the magnetic recording element of the present invention where the core 3, including the enlarged part 3a, was formed and an average ratio of the decreasing degree of the recording signal output after 10 hours elapsed was obtained. Similarly, an average value of the recording signal output of an initial state of the magnetic recording element of the comparative example where the enlarged part was not included in the core, and an average ratio of the decreasing degree the recording signal output after 10 hours elapsed was obtained. The results are illustrated in Table. 1. In addition, the recording signal outputs of the initial state are indicated with a relative value with respect to an average value of the magnetic recording element of the comparative example setting as 100.

TABLE 1

|  | Comparative Example | The Present Invention |
| --- | --- | --- |
| Recording Signal Output | 100 | 99.3 |
| Output Decrease | 35.2% | 0.9% |

Figure 7:
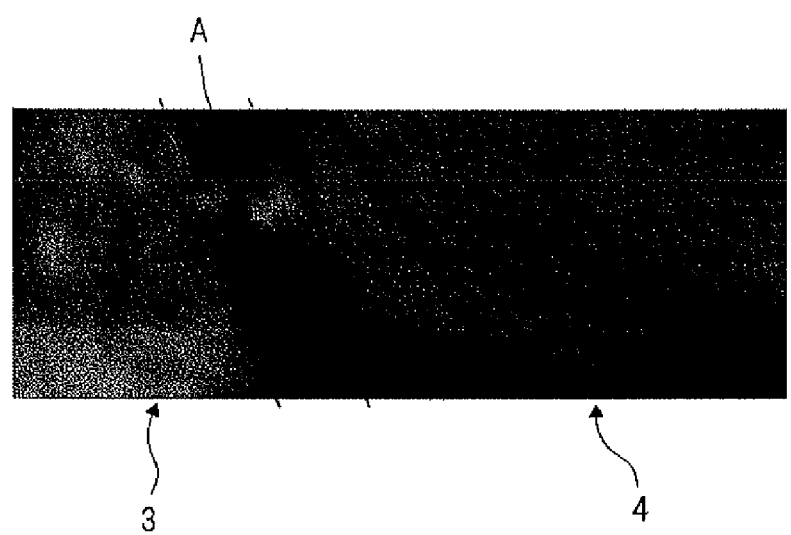
FIG. 7 is an enlarged view illustrating a state where a waveguide of the magnetic recording element of the comparative example is altered.

Referring to Table 1, according to the present invention, the recording signal outputs of the initial state of each of the comparative example and the present invention are almost the same. Then, when ten hours had passed, a 35.2% output decrease was observed in the comparative example, meaning that a performance of the magnetic recording element was greatly decreased. On the other hand, a 0.9% output decrease was observed in the present invention, meaning that the performance of the magnetic recording element was almost not decreased at all. Then, the air bearing surface S of the magnetic recording element of the comparative example where the performance was greatly decreased was observed with an atomic force microscope (AFM). A picture taken with this AFM is illustrated in FIG. 7. As is obvious from FIG. 7, the generation of part A (the part of particularly dark black) where $AlO_x$ disappeared was observed at the interface of $TaO_x$ (the relatively black part) configuring the core 3 positioned on the right side of the drawing, and $AlO_x$ (the relatively white part) configuring the cladding 4 positioned on the left side of the drawing. Accordingly, it is concluded that the generation of the part A where $AlO_x$ that forms the cladding 4 disappeared caused the significant decrease of the recording signal output (decline of the performance) as illustrated in Table. 1.

Next, a size of the enlarged part 3a of the core 3 of the magnetic recording element 1 of the present invention will be considered.

First, in order to excite a near-field, it is required that laser light in a single mode propagates through the core 3 of the waveguide 2. Although this depends on a refractive indices of the core 3 and the cladding 4, it is necessary for this that a cross sectional size of the core 3 should be the wavelength size of the laser light 19 or less. Accordingly, in the present embodiment, the cross sectional size of the main part of the core 3 (the part except for the enlarged part 3a) was set in 0.4 µm×0.4 µm. However, in order to suppress alteration and deformation of the core 3 and the cladding 4, the enlarged part 3a having a length of 2.0 µm in a transversal direction (the x-direction) is disposed in the present invention.

Figure 8:
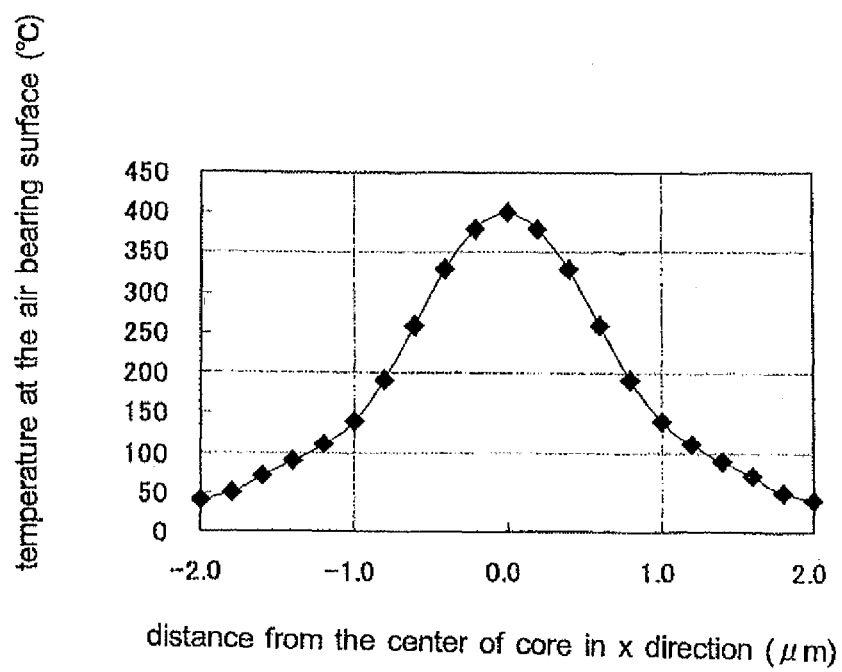
FIG. 8 is a graph illustrating a relationship between a distance from the center of the core of the magnetic recording element in the x-direction and a temperature at the air bearing surface.

Then, the present applicant executed a thermal calculation considering a thermal conductivity of each material that forms the magnetic recording element 1. FIG. 8 illustrates the resulting calculations of the relation between a distance from the center of heating (the center of the core or the vicinity) in the transversal direction (the x-direction) and the temperature at the air bearing surface S under a condition where the magnetic recording medium 14 having high coersive force is sufficiently heated (the highest temperature is approximately 400 C.°). Referring to FIG. 8, since an area in which the distance from the center of heating is approximately ±1 µm is heated to approximately 150 C.°, the alteration, as illustrated in FIG. 7, for example, occurs so that a chronological decrease in the recording signal output may become large. On the other hand, when the distance from the center of heating is approximately ±2 µm, the temperature increase becomes relatively small. Therefore, it is preferable that the distance between the interface of the enlarged part 3a of the core 3 and the cladding 4 and the center of heating (the center of the core or its vicinity) is ±2 µm or over ±2 µm. For this, the size of the enlarged part 3a of the core 3 is preferably ±2 µm or over ±2 µm.

In addition, a temperature profile illustrated in FIG. 8 does not correspond to a so-called thermal dominant recording that determines a recording area by narrowing temperature distribution. FIG. 8 shows a temperature profile in which a distribution of a magnetic field needs to be steep and both magnet and heat are utilized to determine a magnetization pattern. On the other hand, to execute a thermal dominant recording, the heat distribution must be more steep and so a high-temperature area in the vicinity of the air bearing surface S is further narrowed. Therefore, as a practical consideration, if the width of the enlarged part 3a of the core 3 at the air bearing surface S is set to be 2 µm or over 2.0 µm, then a preferable result of thermal assisted magnetic recording of every system can be obtained.

In the present embodiment, as illustrated in FIGS. 1 and 4, a length of the enlarged part 3a of the core 3 is enlarged in the traversal direction (which can be referred to as either the x-direction, the lamination in-plane direction, or the cross-track direction). However, a length is not enlarged in a direction perpendicular to the transversal direction (which can be referred to as either the z-direction, the lamination surface perpendicular direction, or the down track direction). In principle, the enlarged part 3a is preferably enlarged in the z-direction as well as in the x-direction from the standpoint of preventing the alteration and deformation of the waveguide 2. However, using a configuration in which the enlarged part 3a is enlarged only in the x-direction, as illustrated in FIGS. 1 and 4, is most simple and effective, considering a downsizing of the magnetic recording element, a simplification of a manufacturing process, a cost-reduction by not increasing an amount of material used, and an improvement of a high-efficiency of the near-field light generation.

Next, a size of the enlarged part 3a of the core 3 in a direction perpendicular to the air bearing surface S (the y-direction) will be considered.

Figure 9:
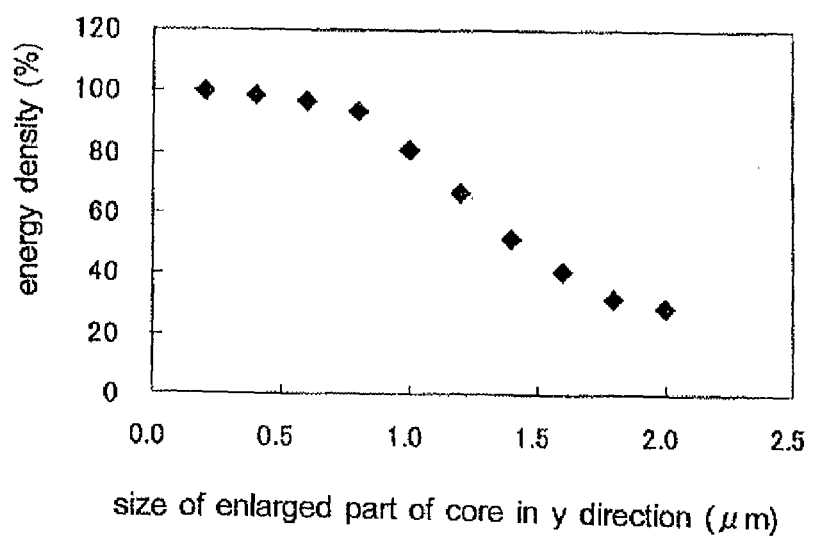
FIG. 9 is a graph illustrating a relationship between the size of an enlarged part of the magnetic recording element in the y-direction and an energy density.

When the enlarged part 3a is large in a view seen from the direction perpendicular to the air bearing surface S (the y-direction), an energy density to transduce a propagating light 19 that propagates through the core 3 into a surface plasmon 23 and to generate a near-field light 24 is decreased. As a result, the efficiency may decrease, and sufficient heating may not be executed. The present applicant used a core 3 that is made of $TaO_x$ and that has the square cross section of 0.4 µm×0.4 µm and a cladding 4 that is made of AlO$_x$ and that surrounds the core 3. Then, the present applicant executed calculations based on a finite difference time domain (FDTD) method regarding the magnetic recording element 1 where the plasmon generator 16 made of Au and adjacent to the core 3 is disposed. At that time, the shortest distance between the core 3 (a portion except for the enlarged part 3a) and the plasmon generator 16 was 35 nm, and a Gaussian beam having the wavelength of 800 nm was used as the light source 18. The magnetic recording medium 14 was positioned only 6 nm away from the air bearing surface S of the magnetic recording element 1. Then, the energy transferred to the magnetic recording medium was calculated. FIG. 9 illustrates a relationship (a dependency of energy transferred to the magnetic recording medium 14 with respect to the size of the enlarged part 3a in the y-direction) between the energy density and the size of the enlarged part 3a in the y-direction (the distance from the air bearing surface S). The energy density indicates how much the propagating light is transduced to the near-field light. The energy density is indicated with a relative value that is defined as 100% where a thickness in the y-direction is 0 μm (or a state in which the enlarged part 3a does not exist).

As a result, when the thickness in the y-direction is approximately 0.8 μm or less, i.e., when the thickness is similar to the wavelength of the laser light 19, an energy density of 90% or more was maintained, and no large variation of the energy transferred to the magnetic recording medium 14 was observed. However, when the thickness in the y-direction is more than 0.8 μm, i.e., when the enlarged part 3a is thicker than the wavelength of the laser light 19, a remarkable decrease in the energy transferred to the magnetic recording medium 14 was observed.

The energy transferred to the magnetic recording medium 14 is decreased because the laser light 19 of the single mode is not sufficiently trapped in the enlarged part 3a, whereas the laser light in the single mode was trapped in an area up to the enlarged part 3a of the core 3 (a portion of a square of 0.4 μm×0.4 μm) so that the linearity was maintained. The laser light is better trapped as the thickness of the enlarged part 3a in the y-direction decreases. However, even if the core is enlarged in the similar size range as the wavelength of the laser light, evanescent light coupling to the plasmon generator 16 does not receive any significant effect. Therefore, the high energy density can be maintained.

In principle, there is no problem caused by a small thickness of the enlarged part 3a in the y-direction. Therefore, if the interface of the enlarged part 3a of the core 3 and the cladding 4 in the air bearing surface S could be positioned away from the center of heating, there would be no need to limit the thinness of the enlarged part 3a (decrease of the thickness in y-direction). However, in practical terms, considering the limitations of manufacturing techniques and margins for misalignment at the time of lapping, the thickness in the y-direction is preferably 0.05 μm or more.

As described above, the conditions below are preferable to realize both: the effect of decreased coercive force of the magnetic recording medium 14 by the heating; and the effect of suppressed alteration and deformation of primarily the waveguide 3 of the magnetic recording element 1 by the heat. The above conditions are: a length of the enlarged part 3a of the core 3 in the transversal direction (the x-direction) in the air bearing surface S is 2 μm or over; a length of the enlarged part 3a in the perpendicular direction (the y-direction) to the air bearing surface S is 0.05 μm or more, and the length is the wavelength of the laser light 19 or less (for example, 0.8 μm or less). However, the present invention is not limited to these ranges.

Figure 10A:
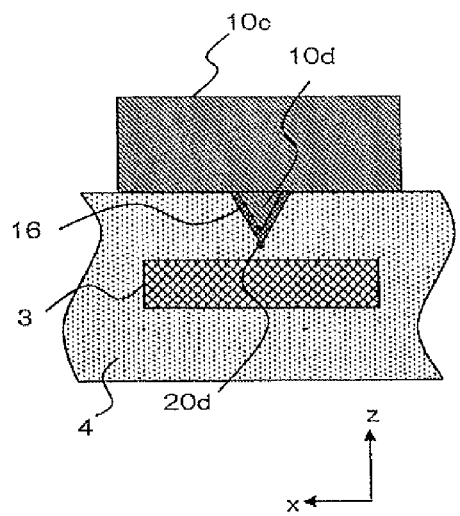
FIGS. 10A-10C are schematical views of waveguides and the plasmon generator of other embodiments of the magnetic recording element of the present invention, seen from the air bearing surface.
Figure 10B:
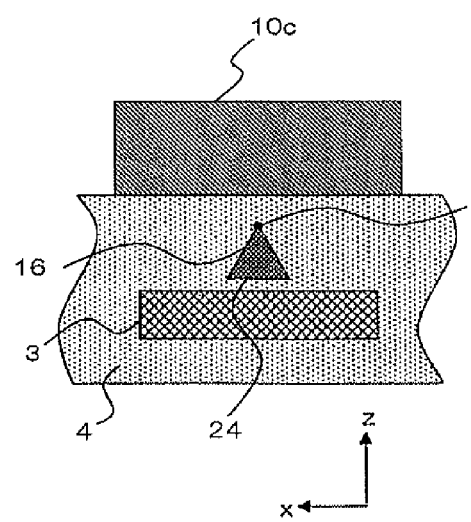
Figure 10C:
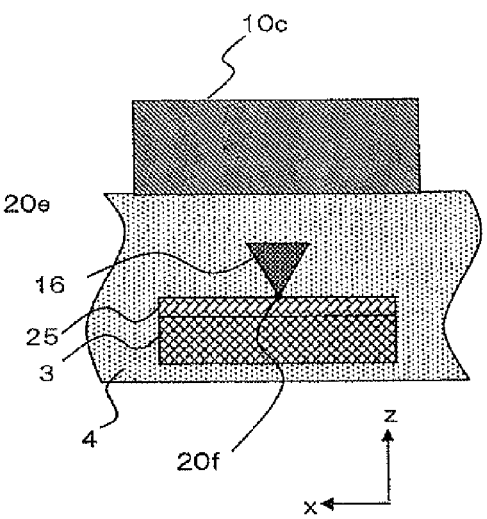

Each of FIGS. 10A-10C illustrates another embodiment of the magnetic recording element 1 of the present invention. The plasmon generator 16 of the magnetic recording element 1 illustrated in FIG. 10A has a V-shaped cross sectional shape where an apex faces the core 3 including the enlarged part 3a. A propagation edge 20d is formed along the apex of the V-shape. The plasmon generator 16 is formed by layering Au, Ag, Cu, Al, Pd, Ru, Pt, Rh, Ir or an alloy primarily consisting of these metals on an protrusive part 10d of the triangular cross section of the main magnetic pole 10, which is projected to the substrate 6 side. The plasmon coupling occurs in the propagation edge 20d, and a near-field generator is formed at an edge part of the air bearing surface S side of the propagation edge 20d.

The plasmon generator 16 of the magnetic recording element 1 illustrated in FIG. 10B has a triangular cross section where one side 24 faces the core 3, including the enlarged part 3a, and has a triangular prism shape as a whole. A material of the plasmon generator 16 is the same as that of the embodiment illustrated in FIG. 5. In the present embodiment, the plasmon coupling occurs in a propagation edge 20e formed along an apex that is away from the core 3, including the enlarged part 3a. In other words, the plasmon coupling occurs in the propagation edge 20e that faces the main magnetic pole 10, and the near-field generator is formed at an edge part of the air bearing surface S side of the propagation edge 20e. In the example illustrated in FIG. 10B, the cladding 4 is disposed between the plasmon generator 16 and the core 3, including the enlarged part 3a. However, the plasmon generator 16 and the core 3, including the enlarged part 3a, may also be directly contacted.

A form and material of the plasmon generator 16 of the magnetic recording element 1 illustrated in FIG. 10C are the same as those of the embodiment illustrated in FIG. 5. In the present embodiment, a buffer portion 25 is disposed between the plasmon generator 16 and the core 3, including the enlarged part 3a. The buffer portion 25 has a smaller refractive index than the core 3, including the enlarged part 3a, and the buffer portion 25 is separately disposed from the cladding 4. In the buffer portion 25, the laser light 19 that propagates through the core 3 is coupled to the plasmon generator 16 in the surface plasmon mode. In the present embodiment, the plasmon coupling occurs in a propagation edge 20f facing the core 3, including the enlarged part 3a, and the near-field generator is formed at an edge part of the air bearing surface S side of the propagation edge 20f.

In each of the embodiments described above, a minute area of the magnetic recording medium 14 is heated with the near-field light 24 in order to achieve a high density recording, and the plasmon generator 16 is disposed close to the waveguide 2. However, the configuration of the present invention, in which the core 3 includes the enlarged part 3a that is enlarged on the air bearing surface S, is also applicable to other configurations where the plasmon generator 16 is not used. In other words, the configuration of the present invention is also applicable to a configuration in which a plasmon antenna is used and a configuration in which laser light 19 is directly irradiated from the core 3 of the waveguide 2 to the magnetic recording medium 14. Similarly, it is applicable to a configuration where only the enlarged part 3a is made of a different material (a dielectric substance) from that of the other part of the core 3.

A description of the preferred embodiment according to the present invention was given above in detail. However, it should be appreciated that a wide variety of alterations and modifications are possible as far as they do not depart from the spirit and scope of the attached claims.

What is claimed is:

1. A magnetic recording element facing a recording medium and executing a magnetic recording while the recording medium is heated, comprising:
   a waveguide that is configured with a core and a cladding, the core, through which laser light propagates, including an enlarged part, which is enlarged at an air bearing surface facing the recording medium; and
   the cladding surrounding a periphery of the core.

2. The magnetic recording element according to claim 1, further comprising:
   a near-field generator positioned to face the core, including the enlarged part, at the air bearing surface.

3. The magnetic recording element according to claim 2, further comprising:
   a main magnetic pole of which an edge part is positioned at the air bearing surface, and
   a plasmon generator facing a part of the core that includes the enlarged part, and extending to the air bearing surface, wherein
   the plasmon generator includes a propagation edge extending in a longitudinal direction,
   the propagation edge provides an overlapping part that overlaps the core, including the enlarged part, and the near-field generator in the longitudinal direction,
   the near-field generator is positioned in a vicinity of the edge part of the main magnetic pole on the air bearing surface,
   the overlapping part of the propagation edge couples with the laser light propagating through the core in a surface plasmon mode and generates a surface plasmon, and
   the propagation edge is configured to let the surface plasmon generated at the overlapping part propagate into the near-field generator.

4. The magnetic recording element according to claim 1, wherein the cladding is made of an aluminum oxide.

5. The magnetic recording element according to claim 1, wherein the core, including the enlarged part, is made of a tantalum oxide.

6. The magnetic recording element according to claim 1, wherein a length of the enlarged part of the core in a cross-track direction of the magnetic recording medium is equal to 2.0 μm or more.

7. The magnetic recording element according to claim 1, wherein a length of the enlarged part of the core in a direction perpendicular to the air bearing surface is equal to a wavelength of the laser light or less.

* * * * *